United States Patent
Tuten et al.

(10) Patent No.: US 10,305,458 B1
(45) Date of Patent: May 28, 2019

(54) REPETITIVE NOISE CANCELATION

(71) Applicant: QUALCOMM Incorporated, San Diego, CA (US)

(72) Inventors: Charles Derrick Tuten, Scottsdale, AZ (US); Aniruddha Bashar, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/937,686

(22) Filed: Mar. 27, 2018

(51) Int. Cl.
| | |
|---|---|
| *H03K 5/1252* | (2006.01) |
| *H03K 5/24* | (2006.01) |
| *H02M 1/08* | (2006.01) |
| *H03K 19/21* | (2006.01) |
| *H02M 1/14* | (2006.01) |
| *H03K 5/00* | (2006.01) |

(52) U.S. Cl.
CPC ............ *H03K 5/1252* (2013.01); *H02M 1/08* (2013.01); *H03K 5/24* (2013.01); *H03K 19/21* (2013.01); *H03K 2005/0015* (2013.01)

(58) Field of Classification Search
CPC .................. H03K 5/1252; H03K 5/24; H02M 2001/0012; H02M 1/14; H02M 1/15; H02M 1/157; H02M 3/157
See application file for complete search history.

(56) References Cited

U.S. PATENT DOCUMENTS

| | | | | |
|---|---|---|---|---|
| 3,705,358 | A * | 12/1972 | Bauman | H03H 17/02 327/38 |
| 3,961,172 | A * | 6/1976 | Hutcheon | G06G 7/1928 708/813 |
| 7,940,033 | B2 * | 5/2011 | Dowlatabadi | H02M 3/156 323/284 |
| 2015/0003621 | A1 | 1/2015 | Trammell | |
| 2015/0236585 | A1 | 8/2015 | Grandy | |
| 2017/0047956 | A1 | 2/2017 | Lu | |
| 2017/0154715 | A1 | 6/2017 | Li | |
| 2017/0279449 | A1 | 9/2017 | Fang et al. | |

* cited by examiner

*Primary Examiner* — Gary L Laxton
(74) *Attorney, Agent, or Firm* — Patterson & Sheridan, L.L.P. QUALCOMM Incorporated

(57) ABSTRACT

Certain aspects of the present disclosure provide an apparatus for noise cancellation. One example apparatus generally includes a first delay path and a second delay path, each providing signals generated by applying a different delay to an input signal, and a first comparator having a first input coupled to the first delay path and a second input coupled to the second delay path. The apparatus also includes a switching circuit having a control input coupled to an output of the first comparator, the switching circuit configured to selectively couple the first delay path or the second delay path to an output node of the switching circuit based on a signal at the control input. The apparatus also includes an attenuation circuit having a first input coupled to an input path for providing the input signal, and a second input coupled to the output node of the switching circuit.

26 Claims, 6 Drawing Sheets

REPETITIVE NOISE CANCELATION

TECHNICAL FIELD

Certain aspects of the present disclosure generally relate to electronic circuits and, more particularly, to a circuit for reducing repetitive noise of a signal.

BACKGROUND

Power management integrated circuits (power management ICs or PMICs) are used for managing the power requirement of a host system. A PMIC may be used in battery-operated devices, such as mobile phones, tablets, laptops, wearables, etc., to control the flow and direction of electrical power in the devices. The PMIC may perform a variety of functions for the device such as direct current (DC)-to-DC conversion, battery charging, power-source selection, voltage scaling, power sequencing, etc. For example, a PMIC may feature a switched-mode power supply (SMPS) for regulating a DC voltage.

SUMMARY

Certain aspects of the present disclosure generally relate to techniques and apparatus for reducing repetitive noise of a signal.

Certain aspects of the present disclosure provide an apparatus for noise cancellation. The apparatus generally includes a first delay path and a second delay path, each configured to provide signals generated by applying a different delay to an input signal; a first comparator having a first input coupled to the first delay path, and a second input coupled to the second delay path; a switching circuit having a control input coupled to an output of the first comparator, the switching circuit configured to selectively couple the first delay path or the second delay path to at least one output node of the switching circuit based on a signal at the control input; and an attenuation circuit having a first input coupled to an input path for providing the input signal, a second input coupled to a first output node of the at least one output node of the switching circuit.

Certain aspects of the present disclosure provide a method for noise cancellation. The method generally includes applying a first delay to an input signal to generate a first delay signal; applying a second delay to the input signal to generate a second delay signal; comparing the first delay signal and the second delay signal; and attenuating the input signal based on the comparison.

Certain aspects of the present disclosure provide an apparatus for noise cancellation. The apparatus generally includes means for applying a first delay to an input signal to generate a first delay signal; means for applying a second delay to the input signal to generate a second delay signal; means for comparing the first delay signal and the second delay signal; and means for attenuating the input signal based on the comparison.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Wireless Device

Figure 1:
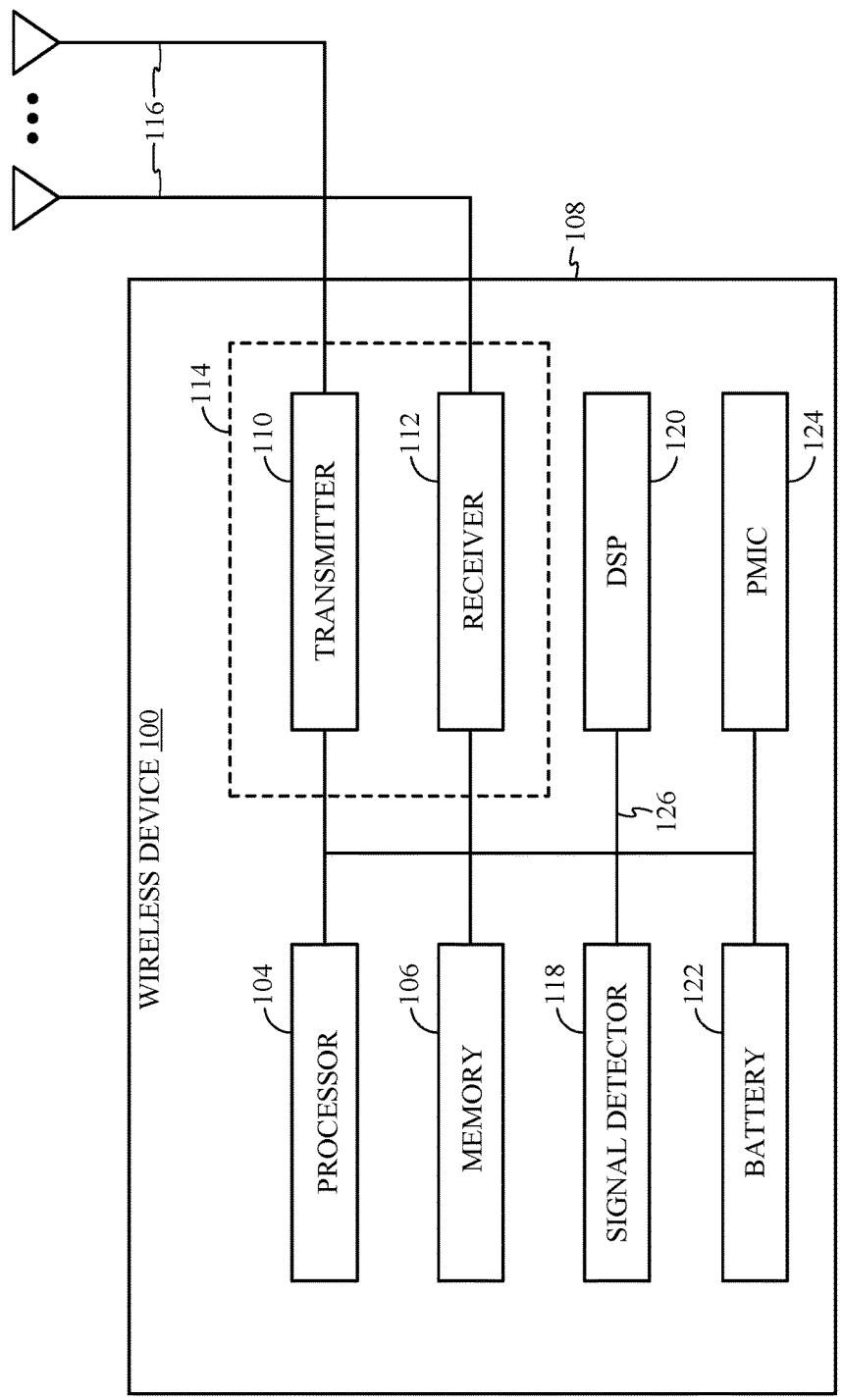
FIG. 1 is a block diagram of an example device including a voltage regulator, according to certain aspects of the present disclosure.

FIG. 1 illustrates an example wireless device 100. The wireless device 100 may be a battery-operated device such as a cellular phone, a personal digital assistant (PDA), a handheld device, a wireless modem, a laptop computer, a tablet, a personal computer, etc. The wireless device 100 is an example of a device that may be configured to implement the various systems and methods described herein. However, the aspects described herein may be implemented in any other suitable electronic device.

The wireless device 100 may include a processor 104 that controls operation of the wireless device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106. The instructions in the memory 106 may be executable to implement the methods described herein.

The wireless device 100 may also include a housing 108 that may include a transmitter 110 and a receiver 112 to allow transmission and reception of data between the wireless device 100 and a remote location. The transmitter 110 and receiver 112 may be combined into a transceiver 114. A plurality of antennas 116 may be attached to the housing 108 and electrically coupled to the transceiver 114. The wireless device 100 may also include (not shown) multiple transmitters, multiple receivers, and multiple transceivers.

The wireless device 100 may also include a signal detector 118 that may be used in an effort to detect and quantify the level of signals received by the transceiver 114. The signal detector 118 may detect such signals as total energy, energy per subcarrier per symbol, power spectral density and other signals. The wireless device 100 may also include a digital signal processor (DSP) 120 for use in processing signals.

The wireless device 100 may further include a battery 122 used to power the various components of the wireless device 100. The wireless device 100 may also include a power management integrated circuit (power management IC or PMIC) 124 for managing the power from the battery to the various components of the wireless device 100. The PMIC 124 may perform a variety of functions for the device such as DC-to-DC conversion, battery charging, power-source selection, voltage scaling, power sequencing, etc. In certain aspects, the DC-to-DC converter of the PMIC 124 may be implemented as a switched-mode power supply (SMPS) having a noise cancellation circuit as described herein.

The various components of the wireless device 100 may be coupled together by a bus system 126, which may include a power bus, a control signal bus, and a status signal bus in addition to a data bus.

Example Techniques for Repetitive Noise Cancellation

In order to reduce noise when generating a signal, such as a power supply signal for components of an electrical device, it is advantageous to be able to distinguish the noise from the desired signal, such that the noise can be attenuated with little to no impact on the desired signal. In some cases, repetitive noise may be coupled onto a signal, which may be caused by other repetitive events of circuitry that are in close proximity. Repetitive noise may be noise events that repeatedly happen at the same time slice of several cyclic periods. In certain aspects of the present disclosure, the repetitive noise may be detected and deleted from the signal in order to generate a desired signal that is absent of any repetitive noise events, while preserving non-repetitive events.

Figure 2:
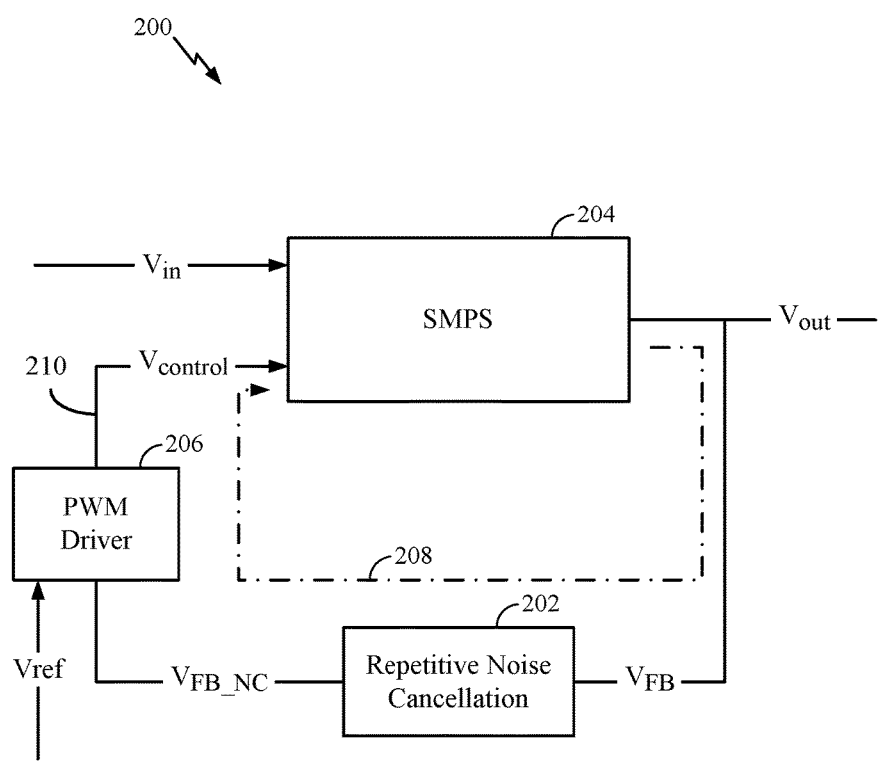
FIG. 2 is a block diagram of an example power supply circuit having a repetitive noise cancellation circuit, in accordance with certain aspects of the present disclosure.

FIG. 2 illustrates a power supply circuit 200 having a repetitive noise cancellation circuit 202, in accordance with certain aspects of the present disclosure. As illustrated, the power supply circuit 200 may include a switched-mode power supply (SMPS) 204 (e.g., a direct-current (DC)-to-DC regulator), that receives an input signal $V_{in}$, and regulates the input signal $V_{in}$ to generate a power output signal $V_{out}$. For example, the SMPS 204 may be a buck converter, a boost converter, or a buck-boost converter. The SMPS 204 includes one or more switches that are opened and closed based on one or more control signals $V_{control}$ in order to regulate the input signal Vin. For example, the power supply circuit 200 may include a feedback path 208 having the repetitive noise cancellation circuit 202 and a pulse-width modulation (PWM) driver circuit 206. The control signal(s) $V_{control}$ may be one or more PWM signals generated by the PWM driver circuit 206, which are provided to gate drive node(s) 210 of the SMPS 204 to drive the gate(s) of the switches of the SMPS 204. The PWM driver circuit 206 may receive a feedback signal $V_{FB}$ generated based on the power output signal $V_{out}$, based on which the PWM driver circuit 206 may adjust the duty cycle of the control signal(s) $V_{control}$ to regulate the voltage of the output signal $V_{out}$, for example, to match a reference voltage $V_{ref}$.

In some cases, the switching activity of the SMPS 204 may couple onto the feedback signal $V_{FB}$. The noise coupled onto the feedback signal $V_{FB}$ may be repetitive and correspond to the switching frequency of the SMPS 204. Thus, in certain aspects of the present disclosure, the repetitive noise cancellation circuit 202 may be implemented to cancel, or at least attenuate, the repetitive noise and generate a noise-cancelled feedback signal $V_{FB\_NC}$, as illustrated. Moreover, the repetitive noise cancellation circuit 202 allows for the repetitive noise to be attenuated with little to no impact on transient signals. Thus, the repetitive noise cancellation circuit 202 may provide the noise-cancelled feedback signal $V_{FB\_NC}$ for the PWM driver circuit 206 to more accurately control the SMPS 204 operations via the control voltage $V_{control}$.

Figure 3:
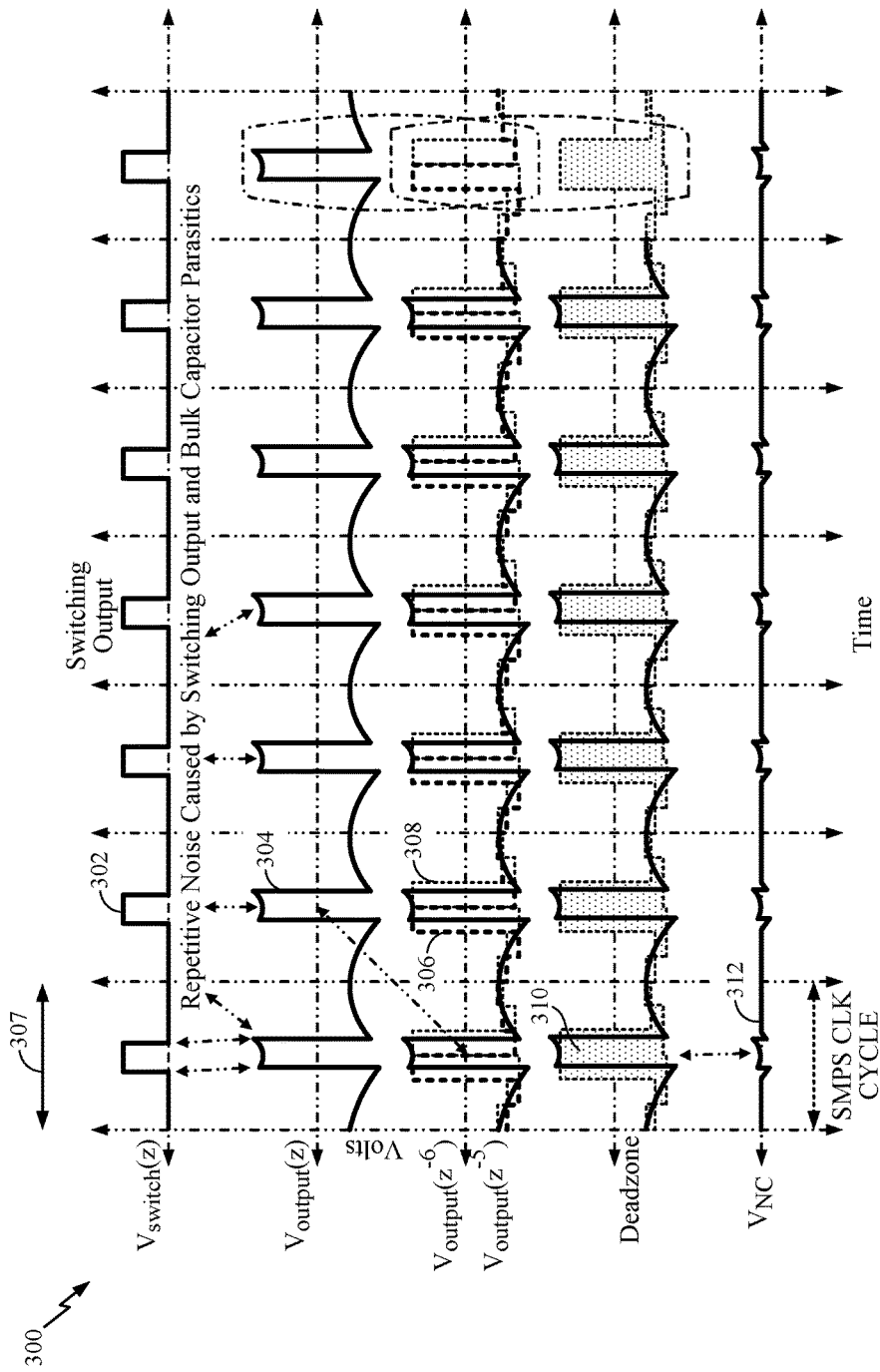
FIG. 3 is a graph illustrating an example technique for reducing repetitive noise, in accordance with certain aspects of the present disclosure.

FIG. 3 is a graph 300 illustrating an example technique for reducing repetitive noise, in accordance with certain aspects of the present disclosure. As illustrated, the signal $V_{output}^{(z)}$ 304 (e.g., corresponding to the feedback signal $V_{FB}$ of FIG. 2) may experience several repetitive noise events. In some cases, these repetitive noise events may be caused by a switching signal $V_{switch}^{(z)}$ 302 in the SMPS 204. For example, the switching signal $V_{switch}^{(z)}$ may correspond to the control signal $V_{control}$ used to regulate the voltage of the output signal $V_{out}$. As illustrated, each of the repetitive noise events occurs slightly after a transition edge of the switching signal $V_{switch}^{(z)}$ 302.

In certain aspects of the present disclosure, a first delay signal $V_{output}^{(z^{-5})}$ 306 and a second delay signal $V_{output}^{(z^{-6})}$ 308 may be generated by applying different delays to the signal $V_{output}^{(z)}$ 304. In certain aspects, the signal $V_{output}^{(z)}$ may be sampled (e.g., by a zero-order hold circuit) at a rate greater than a switching rate (e.g., corresponding to a sampling frequency) of the SMPS 204. This may be referred to as the "oversampling rate." For example, the signal $V_{output}^{(z)}$ may be sampled at six times the switching rate of the SMPS 204, such that six sample periods occur for every cyclic period (e.g., period 307) of the SMPS 204 (i.e., an oversampling rate of 6×). In certain aspects, a bank of capacitors may be used to store the over-sampled cyclic period. A person having ordinary skill in the art will understand that oversampling rates other than 6× may be used. As illustrated in the graph 300, the value at the start of each sample period may be sampled and held for the duration of the sample period. Thus, the delay signal $V_{output}^{(z^{-5})}$ is generated by applying a delay of five sample periods to a sampled-and-held version of the signal $V_{output}^{(z)}$, and the delay signal $V_{output}^{(z^{-6})}$ is generated by applying a delay of six sample periods to the sampled-and-held version of the signal $V_{output}^{(z)}$.

In certain aspects of the present disclosure, a dead-zone 310 may be implemented in the area in the graph 300 between the two delay signals $V_{output}^{(z^{-5})}$ and $V_{output}^{(z^{-6})}$ for each sample period. The signal $V_{output}^{(z)}$ is then adjusted based on the dead-zone 310 to generate the noise-cancelled voltage signal ($V_{NC}$) 312, as will be described in more detail herein.

Figure 4:
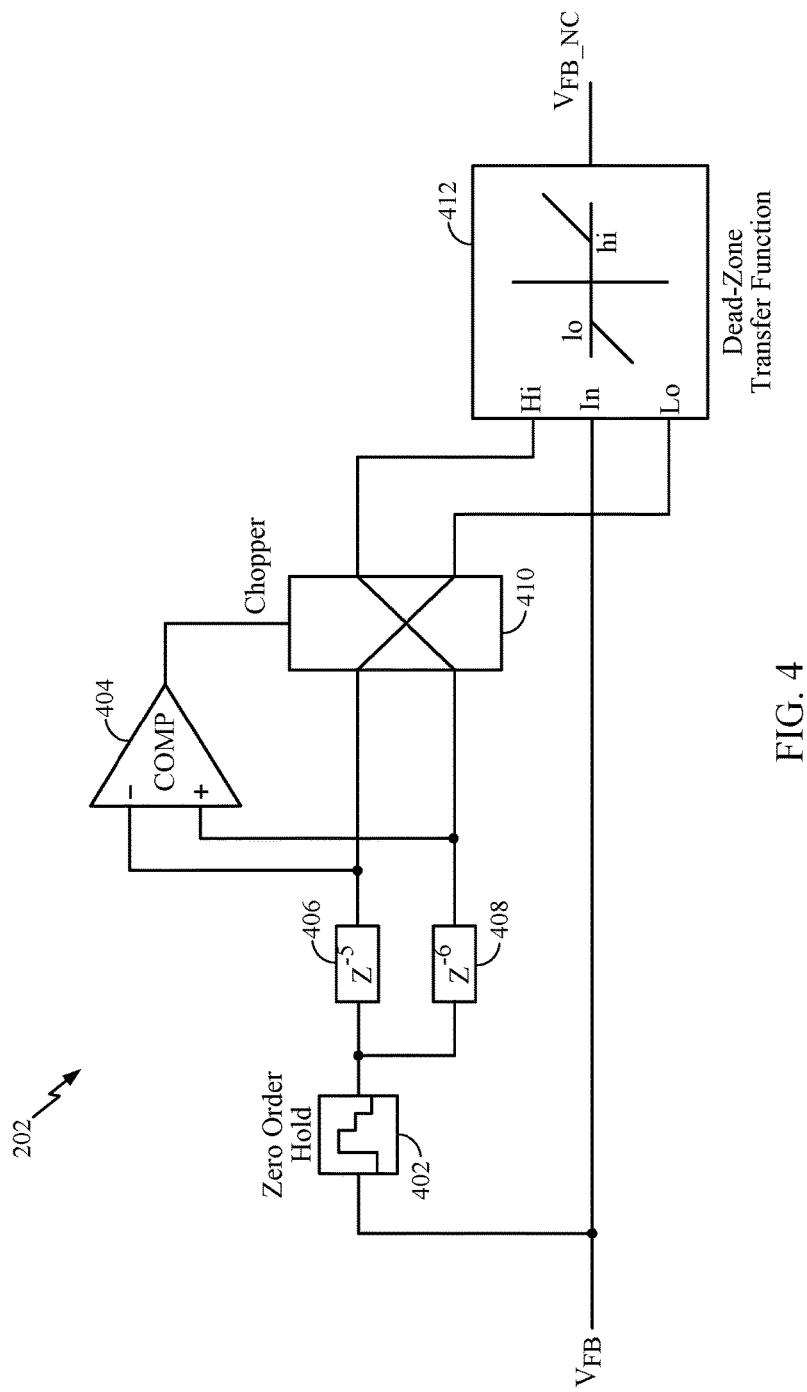
FIG. 4 is a block diagram of an example implementation of the repetitive noise cancellation circuit, in accordance with certain aspects of the present disclosure.

FIG. 4 is a block diagram of an example implementation of the repetitive noise cancellation circuit 202, in accordance with certain aspects of the present disclosure. For example, the repetitive noise cancellation circuit 202 may include a zero-order hold circuit 402 that may receive and sample an input signal (e.g., the feedback signal $V_{FB}$) at a certain sampling frequency. For example, as presented described, the feedback signal $V_{FB}$ may be sampled at a rate greater (e.g., six times greater) than a switching rate (e.g., corresponding to a sampling frequency) of the SMPS 204.

The output of the zero-order hold circuit 402 may be coupled to a delay element $Z^{-5}$ 406 and a delay element $Z^{-6}$ 408. The delay element $Z^{-5}$ applies a delay of five sample periods, while the delay element $Z^{-6}$ applies a delay of six sample periods, according to a sampling rate that is a factor of six greater than the switching rate of the SMPS 204. The repetitive noise cancellation circuit 202 may also include a comparator 404 that compares the outputs of the delay element $Z^{-5}$ 406 and the delay element $Z^{-6}$ 408 and controls a chopper circuit 410 (e.g., a switching circuit). The chopper circuit 410 selectively routes the outputs of the delay elements to the Hi and Lo inputs of a dead-zone transfer function circuit 412, based on the signal at the output of the comparator 404. The dead-zone transfer function circuit 412 attenuates the feedback signal $V_{FB}$ based on the voltage at the Hi and Lo inputs. The Hi and Lo inputs represent the dead zone (e.g., the dead-zone 310) for each sample period. For example, as illustrated, if the voltage of the feedback signal $V_{FB}$ falls between the voltages at the Hi and Lo inputs (i.e., is in the dead zone), the dead-zone transfer function circuit 412 outputs a voltage of zero to generate the noise-cancelled feedback signal $V_{FB\_NC}$. If the voltage of the feedback signal $V_{FB}$ is greater than the voltage at the Hi input (i.e., is outside the dead zone), the dead-zone transfer function circuit 412 adjusts the voltage of the feedback signal $V_{FB}$ by the voltage at the Hi input (i.e., outputs the difference between the feedback signal $V_{FB}$ and the voltage at the Hi input) to generate the noise-cancelled feedback signal $V_{FB\_NC}$. If the voltage of the feedback signal $V_{FB}$ is less than the voltage at the Lo input (i.e., is outside the dead zone), the dead-zone transfer function circuit 412 adjusts the voltage of the feedback signal $V_{FB}$ by the voltage at the Lo input (i.e., outputs the difference between the feedback signal $V_{FB}$ and the voltage at the Lo input) to generate the noise-cancelled feedback signal $V_{FB\_NC}$. The reader can see that the noise-cancelled feedback signal $V_{FB\_NC}$ of FIG. 4 may correspond to the noise-cancelled voltage signal ($V_{NC}$) 312.

Figure 5:
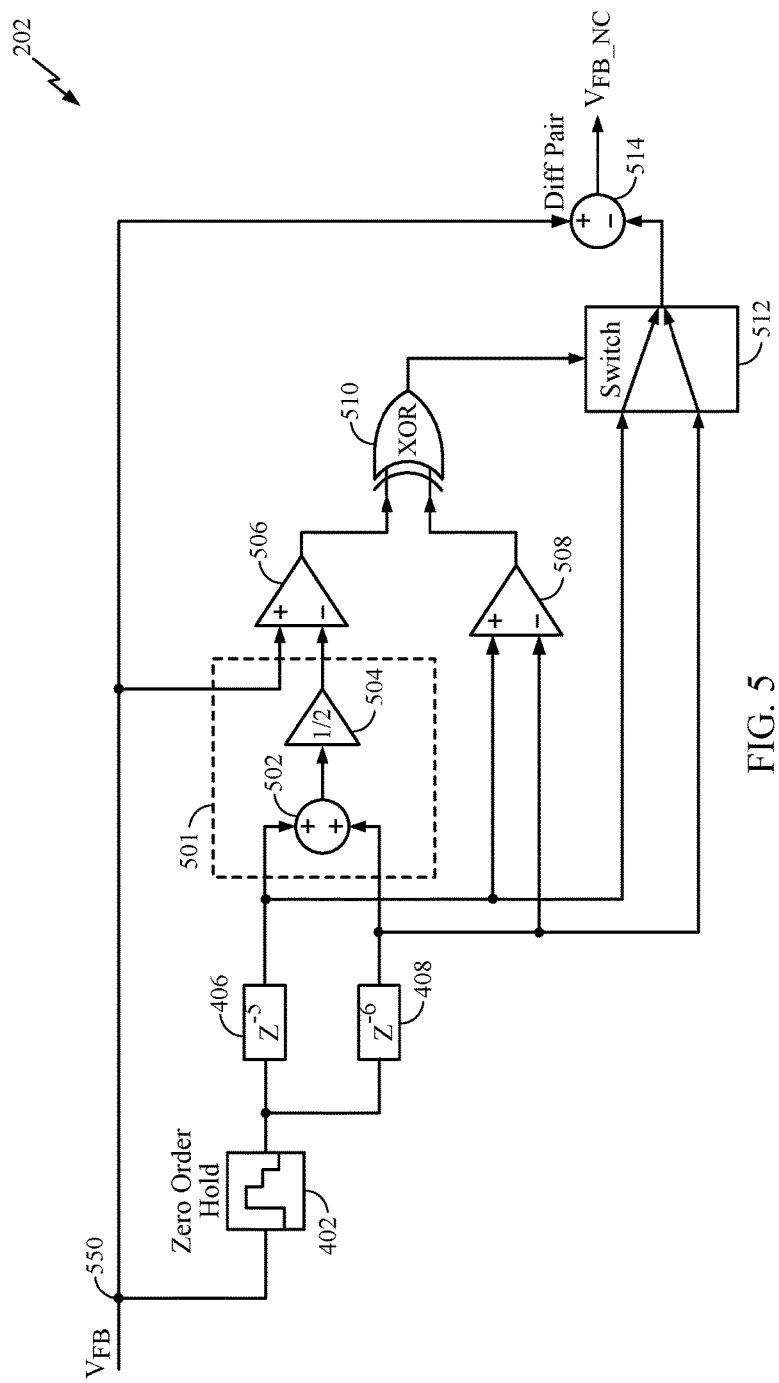
FIG. 5 is a block diagram illustrating another implementation of the repetitive noise cancellation circuit, in accordance with certain aspects of the present disclosure.

FIG. 5 is a block diagram illustrating another implementation of the repetitive noise cancellation circuit 202, in accordance with certain aspects of the present disclosure. In this case, the repetitive noise cancellation circuit 202 includes an average voltage detector circuit 501 for determining an average voltage of the delay signals $Z^{-6}$ and $Z^{-5}$. For example, the outputs of the delay element $Z^{-5}$ 406 and the delay element $Z^{-6}$ 408 are summed by an adder circuit 502, the output of which is divided by two by a divider circuit 504, as illustrated. Thus, the output of the divider circuit 504 represents the average voltage of the delay signals $Z^{-6}$ and $Z^{-5}$ generated by the delay element $Z^{-5}$ 406 and the delay element $Z^{-6}$, respectively.

The detected average voltage is input to a negative input terminal of a comparator 506, which compares the detected average voltage of the delay signals $Z^{-6}$ and $Z^{-5}$ to the voltage of the feedback signal $V_{FB}$. As illustrated, the negative input terminal of the comparator 506 may be coupled to the output of the divider circuit 504, and the positive input terminal of the comparator 506 may be coupled to a node 550 for receiving the feedback signal $V_{FB}$. Thus, the output of the comparator 506 may be logic high if the feedback signal $V_{FB}$ is greater than the average voltage of the delay signals $Z^{-6}$ and $Z^{-5}$, and may be logic low if the feedback signal $V_{FB}$ is less than the average voltage of the delay signals $Z^{-6}$ and $Z^{-5}$.

In certain aspects, the repetitive noise cancellation circuit 202 may also include a comparator 508 for comparing the delay signals $Z^{-5}$ and $Z^{-6}$ and providing an indication of which of the delay signals $Z^{-5}$ and $Z^{-6}$ has a higher voltage. For example, the delay signal $Z^{-6}$ may be input to the positive input terminal of the comparator 508, and the delay signal $Z^{-5}$ may be input to the negative input terminal of the comparator 508. Therefore, the output of the comparator 508 may be logic high if the voltage of the delay signal $Z^{-6}$ is greater than the voltage of the delay signal $Z^{-5}$, or may be logic low if the voltage of the delay signal $Z^{-6}$ is less than the voltage of the delay signal $Z^{-5}$.

As illustrated, the outputs of the comparators 506 and 508 are provided to inputs of an exclusive OR (XOR) logic gate 510, the output of which controls a switching circuit 512. The switching circuit selectively couples one of the delay signals $Z^{-5}$ and $Z^{-6}$ to a negative input of a differential circuit 514. For example, when the output of the XOR logic gate 510 is logic low, the switching circuit 512 electrically couples the delay signal $Z^{-6}$ to the differential circuit 514, and when the output of the XOR logic gate 510 is logic high, the switching circuit 512 electrically couples the delay signal $Z^{-5}$ to the differential circuit 514.

The differential circuit 514 detects the difference of the voltage between the feedback signal $V_{FB}$ and the delay signal $Z^{-5}$ or $Z^{-6}$ provided by the switching circuit, to generate a noise-cancelled feedback signal ($V_{FB\_NC}$). In other words, if the voltage of the feedback signal $V_{FB}$ is greater than the average voltage of the delay signal $Z^{-5}$ or $Z^{-6}$, the differential circuit 514 subtracts one of the delay signals $Z^{-5}$ and $Z^{-6}$ having a greater voltage from the feedback signal $V_{FB}$. If the voltage of the feedback signal $V_{FB}$ is less than the average voltage of the delay signal $Z^{-5}$ or $Z^{-6}$, the differential circuit 514 subtracts one of the delay signals $Z^{-5}$ and $Z^{-6}$ having a lesser voltage from the voltage of the feedback signal $V_{FB}$. While the examples provided herein are implemented to reduce repetitive noise on a feedback signal of an SMPS to facilitate understanding, the techniques provided herein can be used to reduce repetitive noise that may be coupled onto any other signals.

Figure 6:
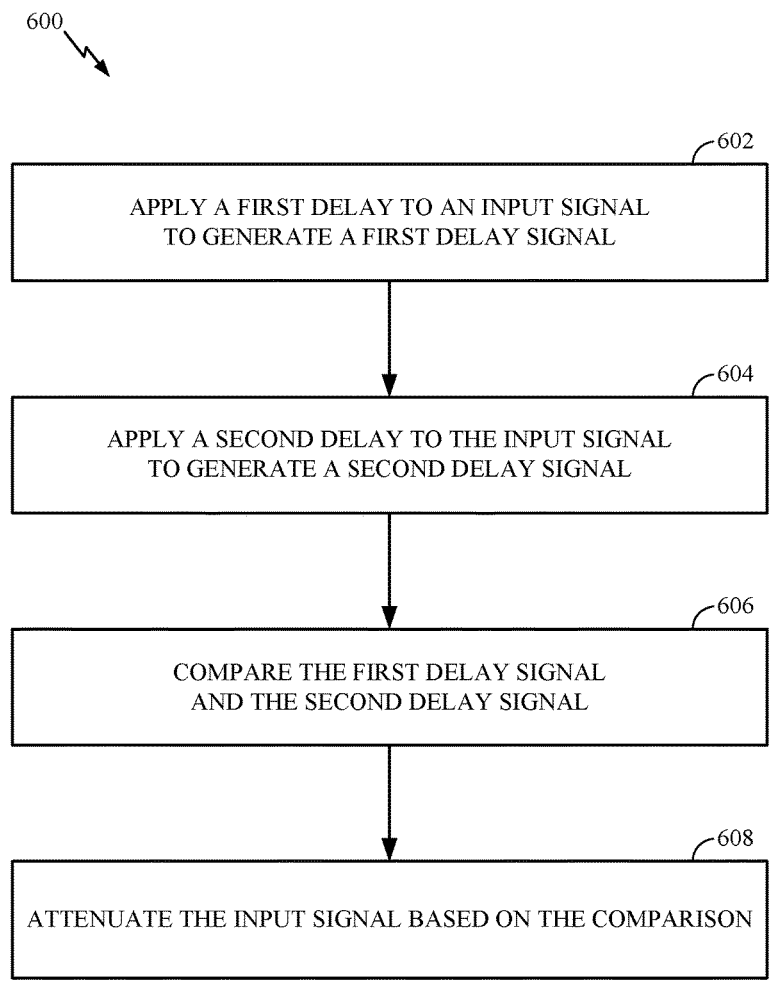
FIG. 6 is a flow diagram illustrating example operations for noise cancellation, in accordance with certain aspects of the present disclosure.

FIG. 6 is a flow diagram illustrating example operations 600 for noise cancellation, in accordance with certain aspects of the present disclosure. The operations 600 may be performed, for example, by a circuit, such as the circuit of FIG. 4 or FIG. 5.

The operations 600 may begin, at block 602, by applying a first delay (e.g., via delay element $Z^{-5}$ 406) to an input signal to generate a first delay signal, and at block 604, applying a second delay (e.g., via delay element $Z^{-6}$ 408) to the input signal to generate a second delay signal. At block 606, the first delay signal and the second delay signal are compared (e.g., via comparator 404), and at block 608, the input signal is attenuated (e.g., via the dead-zone transfer function circuit 412, or differential circuit 514) based on the comparison.

In certain aspects, the operations 600 also include determining an upper threshold voltage and a lower threshold voltage based on the comparison. In this case, the upper threshold voltage comprises one of the first delay signal or the second delay signal having a greater voltage, and the lower threshold voltage comprises the other one of the first delay signal or the second delay signal. In certain aspects, the input signal is attenuated (e.g., via the dead-zone transfer function circuit 412) based on the upper threshold voltage and the lower threshold voltage. For example, in certain aspects, attenuating the input signal includes outputting a difference signal based on a difference between a voltage of the input signal and the upper threshold voltage if the voltage of the input signal is greater than the upper threshold voltage. In certain aspects, attenuating the input signal includes outputting a difference signal based on a difference between the lower threshold voltage and a voltage of the input signal if the voltage of the input signal is less than the lower threshold voltage. In certain aspects, attenuating the input signal includes outputting a zero voltage signal if a voltage of the input signal is between the upper threshold voltage and the lower threshold voltage.

In certain aspects, the operations 600 include selecting one of the first delay signal or the second delay signal having a greater voltage. In certain aspects, the operations 600 also include determining an average voltage (e.g., via the average voltage detector circuit 501) of the first delay signal and the second delay signal, and comparing (e.g., via the comparator 506) a voltage of the input signal to the average voltage, where the selection may be based on the comparison. In this case, if the voltage of the input signal is greater than the average voltage, the attenuating the input signal, at block 608, includes subtracting (e.g., via the differential circuit 514) the voltage of the one of the first delay signal or the second delay signal having the greater voltage from the voltage of the input signal. If the voltage of the input signal is less than the average voltage, the attenuating the input signal, at block 608, includes subtracting (e.g., via the differential circuit 514) the voltage of the other one of the first delay signal or the second delay signal from the voltage of the input signal.

In certain aspect, the operations 600 also include sampling the input signal at a rate corresponding to a sampling frequency. In this case, the first delay and the second delay are applied to the sampled input signal, where the first delay is one sample period greater than the second delay, the sample period corresponding to the sampling frequency.

In certain aspects, the operations 600 also include determining an average voltage (e.g., via the average voltage detector circuit 501) of the first delay signal and the second delay signal, and generating a first comparison signal based on the comparison of the first delay signal and the second delay signal. In certain aspects, a voltage of the input signal is compared to the average voltage to generate a second comparison signal, and an XOR operation of the first comparison signal and the second comparison signal is performed (e.g., via the XOR logic gate 510). In this case, the operations 600 also include selecting the first delay signal or the second delay signal based on a result of the XOR operation, where the attenuating, at block 608, includes subtracting (e.g., via the differential circuit 514) the selected first delay signal or second delay signal from the input signal.

In certain aspects, the operations 600 also include regulating (e.g., via the SMPS 204 a power supply voltage (e.g., Vin of FIG. 2) to generate a regulated power supply voltage. In this case, attenuating the input signal includes attenuating the regulated power supply voltage to generate a feedback signal (e.g., the $V_{FB\_NC}$ of FIG. 2), where the power supply voltage is regulated based on the feedback signal.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for applying a delay may comprise, for example, a delay element, such as the delay element $Z^{-5}$ 406 or delay element $Z^{-6}$ 408. Means for comparing and means for determining may comprise, for example, a comparator, such as the comparator 404, 506, or 508. Means for selecting may include a chopper circuit or switching circuit, such as the chopper circuit 410 or switching circuit 512. Means for attenuating and means for outputting a difference signal may comprise, for example, a dead-zone transfer function circuit, such as the dead-zone transfer function circuit 412, or a differential circuit, such as the differential circuit 514. Means for sampling may comprise, for example, a zero-order hold circuit, such as the zero-order hold circuit 402. Means for performing an XOR operation may comprise, for example, an XOR logic gate, such as the XOR logic gate 510. Means for regulating may comprise, for example, an SMPS, such as the SMPS 204.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for noise cancellation, comprising:
   a first delay path and a second delay path, each configured to provide signals generated by applying a different delay to an input signal;
   a first comparator having a first input coupled to the first delay path, and a second input coupled to the second delay path;
   a switching circuit having a control input coupled to an output of the first comparator, the switching circuit configured to selectively couple the first delay path or the second delay path to at least one output of the switching circuit based on a signal at the control input; and
   an attenuation circuit having a first input coupled to an input path for providing the input signal, and a second input coupled to a first output of the at least one output of the switching circuit.

2. The apparatus of claim 1, wherein:
   the at least one output of the switching circuit comprises a second output;
   a third input of the attenuation circuit is coupled to the second output of the switching circuit; and
   the attenuation circuit is configured to attenuate the input signal based on voltages of signals at the second input and the third input of the attenuation circuit.

3. The apparatus of claim 2, wherein the attenuation circuit is configured to attenuate the input signal by:
   outputting a difference signal based on a difference between a voltage of the input signal and the voltage of the signal at the second input if the voltage of the input signal is greater than the voltage of the signal at the second input; or
   outputting a difference signal based on a difference between the voltage of the signal at the third input and a voltage of the input signal if the voltage of the input signal is less than the voltage of the signal at the third input.

4. The apparatus of claim 2, wherein the attenuation circuit is configured to attenuate the signal by outputting a zero voltage signal if a voltage of the input signal is between the voltages of the signals at the second input and the third input of the attenuation circuit.

5. The apparatus of claim 1, further comprising:
   an average voltage detector configured to detect an average voltage of a first delay signal from the first delay path and a second delay signal from the second delay path;
   a second comparator configured to compare the input signal to the detected average voltage; and
   an XOR logic circuit having a first input coupled to an output of the second comparator and a second input coupled to an output of the first comparator, wherein:
      the control input of the switching circuit is coupled to an output of the XOR logic circuit; and
      the attenuation circuit comprises a differential circuit, the first input of the attenuation circuit coupled to the input path being a positive input of the differential circuit, and the second input of the attenuation circuit coupled to the first output of the switching circuit being a negative input terminal of the differential circuit.

6. The apparatus of claim 5, wherein the switching circuit is configured to couple the first delay path to the first output of the switching circuit if the output of the XOR logic circuit is logic low, and couple the second delay path to the first output of the switching circuit if the output of the XOR logic circuit is logic high, the delay applied to the input signal by the first delay path being greater than the delay applied to the input signal by the second delay path.

7. The apparatus of claim 5, wherein the average voltage detector comprises:
   an adder circuit having a first input coupled to the first delay path and a second input coupled to the second delay path; and
   a divide-by-two circuit having an input coupled to an output of the adder circuit, the average voltage of the signals from the first and second delay paths being generated at an output of the divide-by-two circuit.

8. The apparatus of claim 5, wherein the second comparator comprises an amplifier having a positive input coupled to the input path, and a negative input coupled to an output of the average voltage detector.

9. The apparatus of claim 1, wherein the first comparator comprises an amplifier having a positive input coupled to the first delay path, and a negative input coupled to the second delay path, the delay applied to the input signal by the first delay path being greater than the delay applied to the input signal by the second delay path.

10. The apparatus of claim 1, further comprising:
a zero-order hold circuit having an input coupled to the input path, wherein:
the first delay path comprises a first delay element having an input coupled to an output of the zero-order hold circuit; and
the second delay path comprises a second delay element having an input coupled to the output of the zero-order hold circuit.

11. The apparatus of claim 10, wherein the delay applied by the first delay element is one sample period greater than the delay applied by the second delay element, the sample period corresponding to a frequency at which the zero-order hold circuit samples the input signal.

12. A switched-mode power supply (SMPS) having a feedback path coupled between an output of the SMPS and a gate drive node of the SMPS, wherein the feedback path comprises the apparatus of claim 1.

13. A method for noise cancellation, comprising:
applying a first delay to an input signal to generate a first delay signal;
applying a second delay to the input signal to generate a second delay signal;
comparing the first delay signal and the second delay signal;
attenuating the input signal based on the comparison; and
determining an upper threshold voltage and a lower threshold voltage based on the comparison, wherein:
the upper threshold voltage comprises one of the first delay signal or the second delay signal having a greater voltage;
the lower threshold voltage comprises the other one of the first delay signal or the second delay signal; and
the input signal is attenuated based on the upper threshold voltage and the lower threshold voltage.

14. The method of claim 13, wherein attenuating the input signal comprises:
outputting a difference signal based on a difference between a voltage of the input signal and the upper threshold voltage if the voltage of the input signal is greater than the upper threshold voltage; or
outputting a difference signal based on a difference between the lower threshold voltage and a voltage of the input signal if the voltage of the input signal is less than the lower threshold voltage.

15. The method of claim 13, wherein attenuating the input signal comprises outputting a zero voltage signal if a voltage of the input signal is between the upper threshold voltage and the lower threshold voltage.

16. The method of claim 13, further comprising:
determining an average voltage of the first delay signal and the second delay signal;
selecting one of the first delay signal or the second delay signal having a greater voltage based on the comparison; and
comparing a voltage of the input signal to the average voltage, wherein:
if the voltage of the input signal is greater than the average voltage, the attenuating the input signal comprises subtracting the voltage of the one of the first delay signal or the second delay signal having the greater voltage from the voltage of the input signal; and if the voltage of the input signal is less than the average voltage, the attenuating the input signal comprises subtracting the voltage of the other one of the first delay signal or the second delay signal from the voltage of the input signal.

17. The method of claim 13, further comprising sampling the input signal at a rate corresponding to a sampling frequency, wherein the first delay and the second delay are applied to the sampled input signal, and wherein the first delay is one sample period greater than the second delay, the sample period corresponding to the sampling frequency.

18. The method of claim 13, further comprising:
determining an average voltage of the first delay signal and the second delay signal;
generating a first comparison signal based on the comparison of the first delay signal and the second delay signal;
comparing a voltage of the input signal to the average voltage to generate a second comparison signal;
performing an XOR operation of the first comparison signal and the second comparison signal; and
selecting the first delay signal or the second delay signal based on a result of the XOR operation, wherein the attenuating comprises subtracting the selected first delay signal or second delay signal from the input signal.

19. The method of claim 13, further comprising:
regulating a power supply voltage to generate a regulated power supply voltage, wherein attenuating the input signal comprises attenuating the regulated power supply voltage to generate a feedback signal, wherein the power supply voltage is regulated based on the feedback signal.

20. An apparatus for noise cancellation, comprising:
means for applying a first delay to an input signal to generate a first delay signal;
means for applying a second delay to the input signal to generate a second delay signal;
means for comparing the first delay signal and the second delay signal; and
means for attenuating the input signal based on the comparison; and
means for sampling the input signal at a rate corresponding to a sampling frequency, wherein:
the means for applying the first delay comprises means for applying the first delay signal to the sampled input signal;
the means for applying the second delay comprises means for applying the second delay signal to the sampled input signal; and
the first delay is one sample period greater than the second delay, the sample period corresponding to the sampling frequency.

21. The apparatus of claim 20, further comprising:
means for determining an upper threshold voltage and a lower threshold voltage based on the comparison, wherein:
the upper threshold voltage comprises one of the first delay signal or the second delay signal having a greater voltage;
the lower threshold voltage comprises the other one of the first delay signal or the second delay signal; and
the means for attenuating is configured to attenuate the input signal based on the upper threshold voltage and the lower threshold voltage.

22. The apparatus of claim 21, wherein the means for attenuating the input signal comprises:

means for outputting a difference signal based on a difference between a voltage of the input signal and the upper threshold voltage if the voltage of the input signal is greater than the upper threshold voltage; or means for outputting a difference signal based on a difference between the lower threshold voltage and a voltage of the input signal if the voltage of the input signal is less than the lower threshold voltage.

23. The apparatus of claim 21, wherein the means for attenuating the input signal comprises means for outputting a zero voltage signal if a voltage of the input signal is between the upper threshold voltage and the lower threshold voltage.

24. The apparatus of claim 20, further comprising:
means for determining an average voltage of the first delay signal and the second delay signal;
means for selecting one of the first delay signal or the second delay signal having a greater voltage based on the comparison; and
means for comparing a voltage of the input signal to the average voltage, wherein:
if the voltage of the input signal is greater than the average voltage, the means for attenuating the input signal comprises means for subtracting the voltage of the one of the first delay signal or the second delay signal having the greater voltage from the voltage of the input signal; and
if the voltage of the input signal is less than the average voltage, the means for attenuating the input signal comprises means for subtracting the voltage of the other one of the first delay signal or the second delay signal from the voltage of the input signal.

25. The apparatus of claim 20, further comprising:
means for determining an average voltage of the first delay signal and the second delay signal, wherein the means for comparing the first delay signal and the second delay signal comprises means for generating a first comparison signal based on the comparison of the first delay signal and the second delay signal;
means for comparing a voltage of the input signal to the average voltage to generate a second comparison signal;
means for performing an XOR operation of the first comparison signal and the second comparison signal; and
means for selecting the first delay signal or the second delay signal based on a result of the XOR operation, wherein the means for attenuating comprises means for subtracting the selected first delay signal or second delay signal from the input signal.

26. The apparatus of claim 20, further comprising:
means for regulating a power supply voltage to generate a regulated power supply voltage, wherein the means for attenuating the input signal comprises means for attenuating the regulated power supply voltage to generate a feedback signal, wherein the power supply voltage is regulated based on the feedback signal.

* * * * *